(12) United States Patent
Gerhard et al.

(10) Patent No.: US 11,804,696 B2
(45) Date of Patent: Oct. 31, 2023

(54) SEMICONDUCTOR LASER AND MANUFACTURING METHOD FOR A SEMICONDUCTOR LASER

(71) Applicant: OSRAM OLED GmbH, Regensburg (DE)

(72) Inventors: Sven Gerhard, Alteglofsheim (DE); Christoph Eichler, Donaustauf (DE); Alfred Lell, Maxhütte-Haidhof (DE); Muhammad Ali, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 548 days.

(21) Appl. No.: 16/973,458

(22) PCT Filed: Jun. 12, 2019

(86) PCT No.: PCT/EP2019/065369
§ 371 (c)(1),
(2) Date: Dec. 9, 2020

(87) PCT Pub. No.: WO2019/238767
PCT Pub. Date: Dec. 19, 2019

(65) Prior Publication Data
US 2021/0257812 A1 Aug. 19, 2021

(30) Foreign Application Priority Data
Jun. 13, 2018 (DE) .................... 10 2018 114 133.5

(51) Int. Cl.
*H01S 5/22* (2006.01)
*H01S 5/02* (2006.01)
(Continued)

(52) U.S. Cl.
CPC ............. *H01S 5/22* (2013.01); *H01S 5/0202* (2013.01); *H01S 5/026* (2013.01); *H01S 5/0282* (2013.01); *H01S 5/0424* (2013.01)

(58) Field of Classification Search
None
See application file for complete search history.

(56) References Cited

U.S. PATENT DOCUMENTS

| 5,629,233 A | 5/1997 | Chand et al. |
| 5,773,318 A | 6/1998 | Chand et al. |

(Continued)

FOREIGN PATENT DOCUMENTS

| DE | 102013220641 A1 | 4/2015 |
| DE | 102015119146 A1 | 5/2017 |

(Continued)

OTHER PUBLICATIONS

Japanese Examination Report dated Jan. 24, 2023, JP Application No. 2020-567510, 13 pages (including English translation).

(Continued)

*Primary Examiner* — Tuan N Nguyen
(74) *Attorney, Agent, or Firm* — MH2 TECHNOLOGY LAW GROUP LLP

(57) ABSTRACT

A semiconductor laser (1) is provided that includes a semiconductor layer sequence in which an active zone for generating laser radiation is located. A ridge waveguide is formed as an elevation from the semiconductor layer sequence. An electrical contact layer is located directly on the ridge waveguide. A metallic electrical connection region is located directly on the contact layer and is configured for external electrical connection of the semiconductor laser. A metallic breakage coating extends directly to facets of the semiconductor layer sequence and is arranged on the ridge waveguide. The breakage coating is electrically functionless (Continued)

and includes comprises a lower speed of sound for a breaking wave than the semiconductor layer sequence in the region of the ridge waveguide.

20 Claims, 11 Drawing Sheets

(51) Int. Cl.
  *H01S 5/026* (2006.01)
  *H01S 5/028* (2006.01)
  *H01S 5/042* (2006.01)

(56) References Cited

U.S. PATENT DOCUMENTS

| | | |
|---|---|---|
| 2006/0215719 A1 | 9/2006 | Charache et al. |
| 2008/0001466 A1 | 1/2008 | Patrizi et al. |
| 2008/0014667 A1 | 1/2008 | Hooper et al. |
| 2008/0111142 A1* | 5/2008 | Furushima ............ B82Y 20/00 438/33 |
| 2009/0168827 A1 | 7/2009 | Kawakami et al. |
| 2009/0294797 A1 | 12/2009 | Anzue et al. |
| 2021/0111030 A1 | 4/2021 | Lell et al. |

FOREIGN PATENT DOCUMENTS

| | | |
|---|---|---|
| JP | 200022272 A | 1/2000 |
| JP | 2003031894 A | 1/2003 |
| JP | 2005216990 A | 8/2005 |
| JP | 2007165344 A | 6/2007 |
| JP | 2008205139 A | 9/2008 |
| JP | 2012134293 A | 7/2012 |
| WO | 2018077954 A1 | 5/2018 |

OTHER PUBLICATIONS

Wu, X. et al.: "Thermal Conductivity of Wurtzite Zinc-Oxide from First-Principles Lattice Dynamics—a Comparative Study with Gallium Nitride" https://www.nature.com/articles/srep22504/tables/1, Mar. 1, 2016, Article No. 22504.

Japanese Decision to Grant a Patent dated Jun. 27, 2023, JP Application No. 2020-567510, 4 pages (including English translation).

* cited by examiner

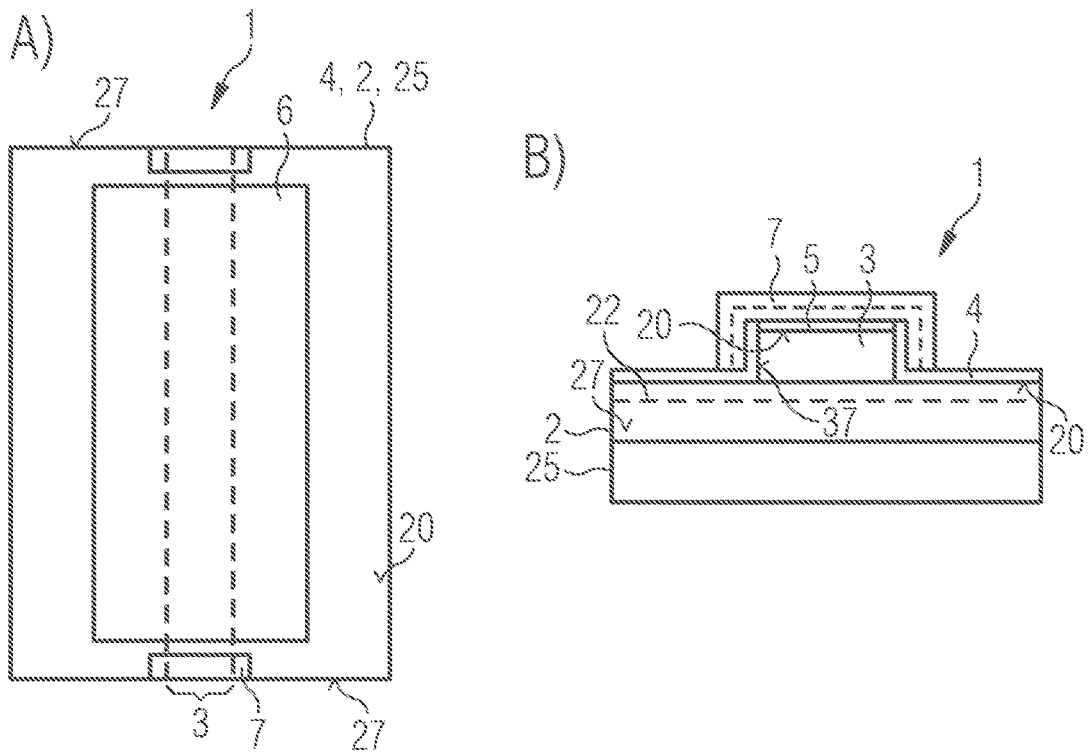
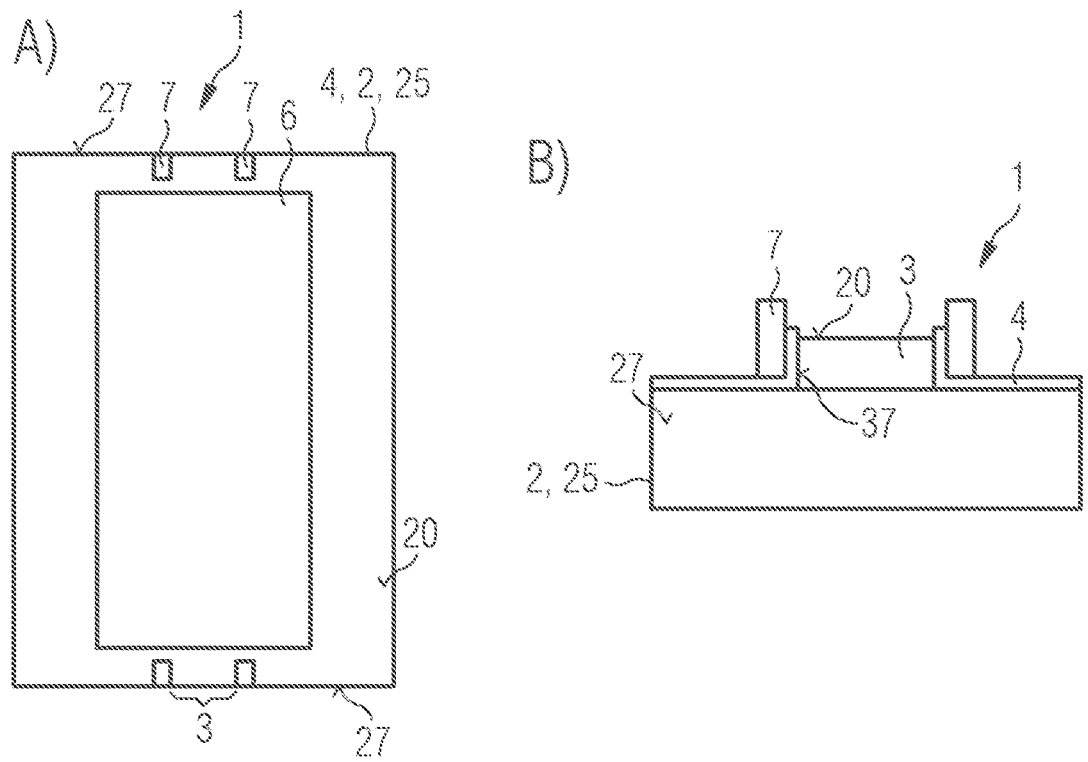

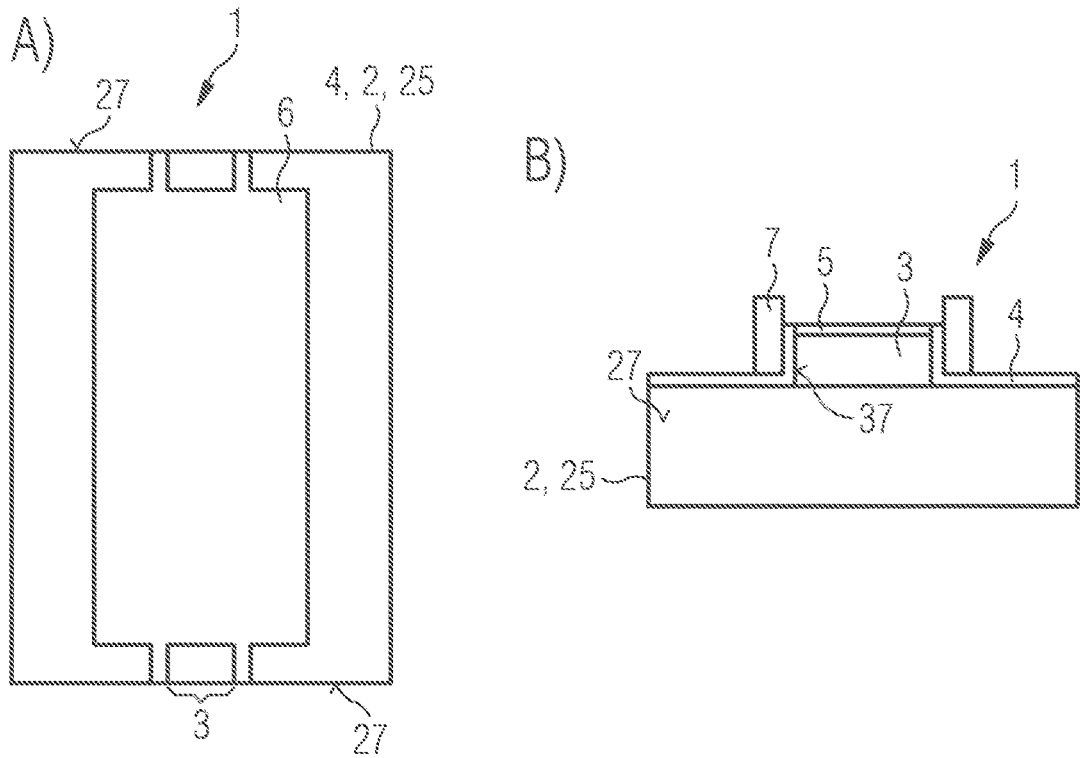
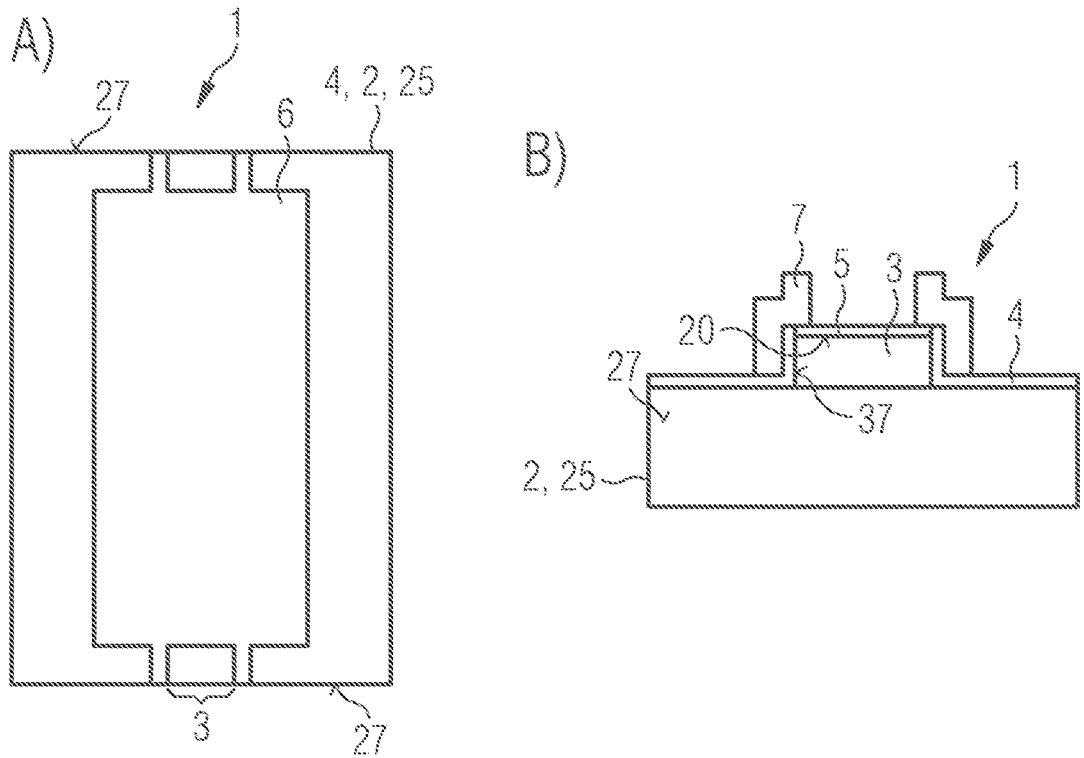

FIG 5
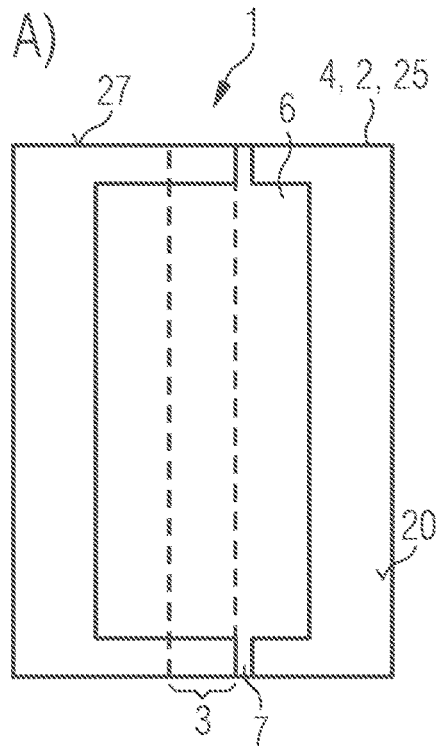
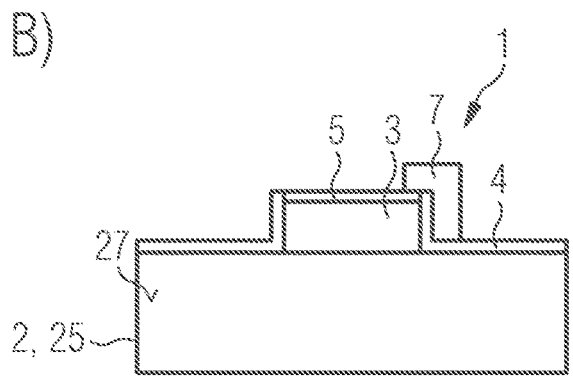
FIG 6
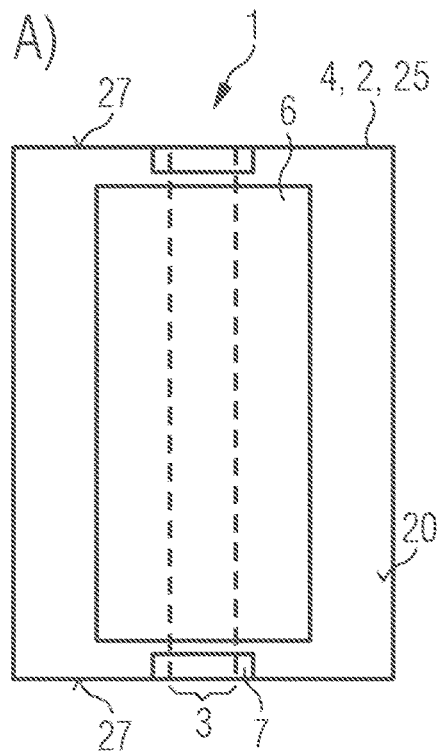
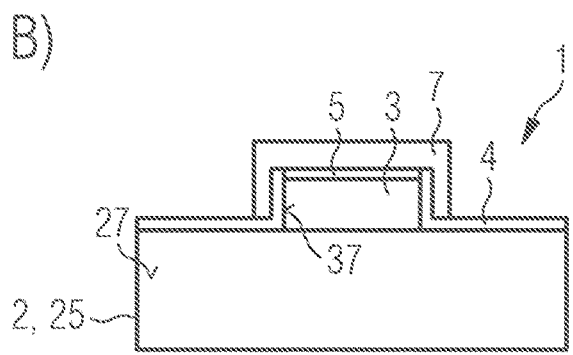
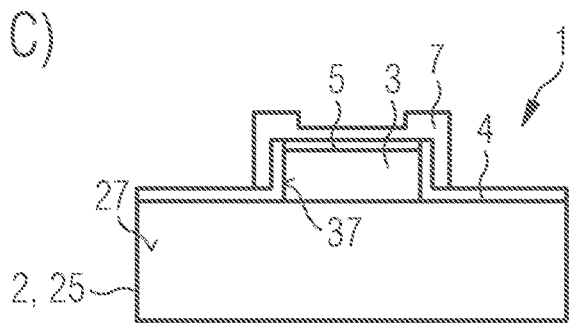

FIG 13
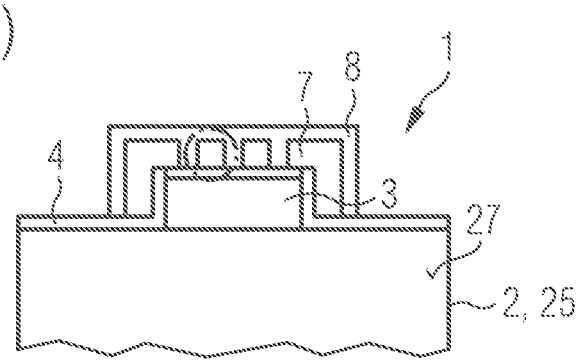
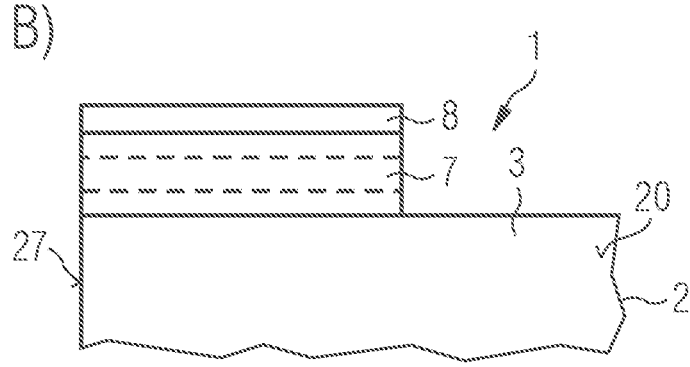
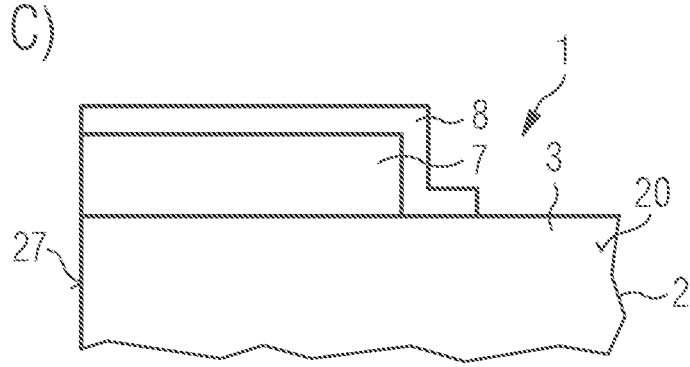

FIG 16
A)
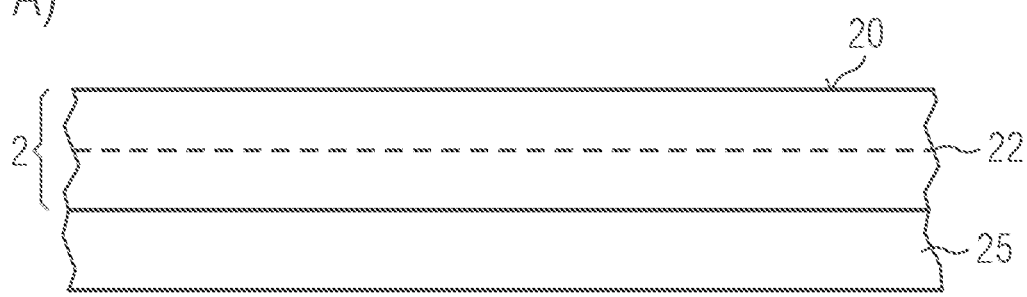
B)
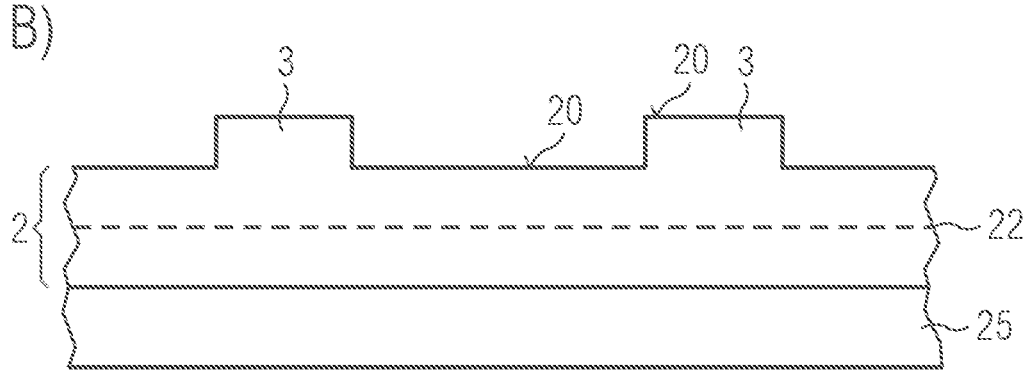
C)
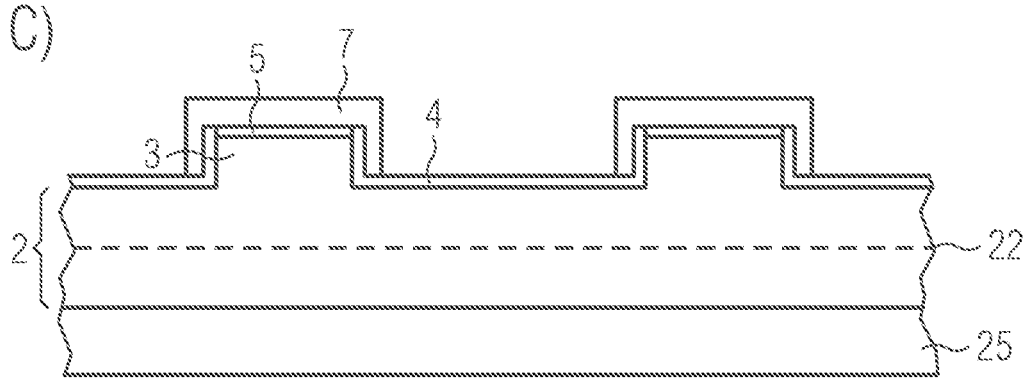

FIG 16
D)
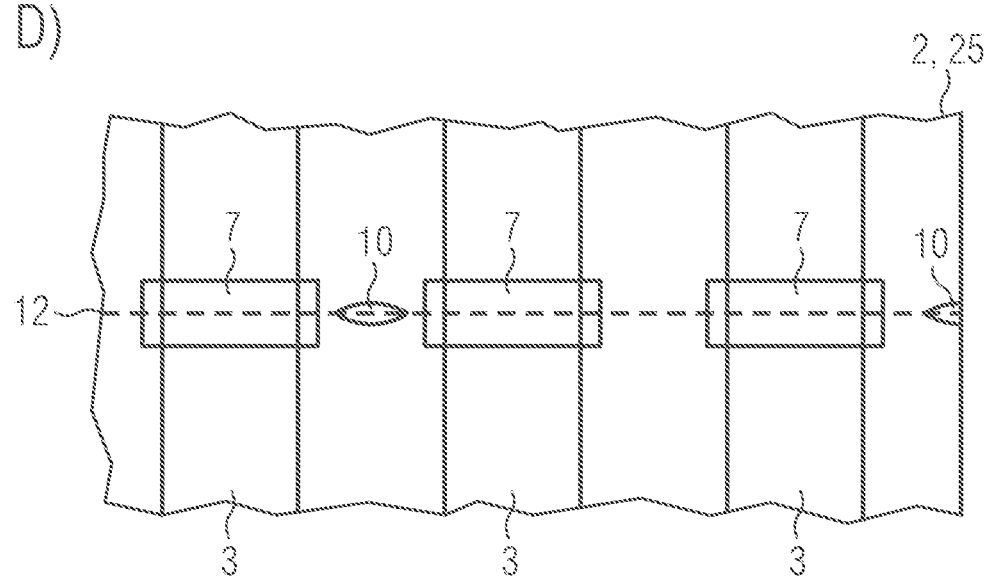
E)
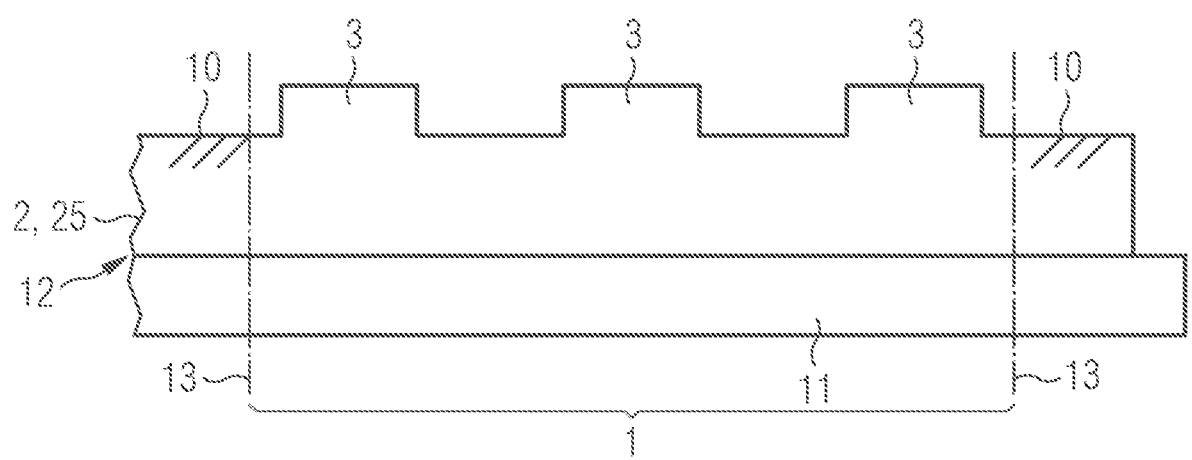

SEMICONDUCTOR LASER AND MANUFACTURING METHOD FOR A SEMICONDUCTOR LASER

CROSS-REFERENCE TO RELATED APPLICATIONS

This patent application is a national stage entry from International Application No. PCT/EP2019/065369, filed on Jun. 12, 2019, published as International Publication No. WO 2019/238767 A1 on Dec. 19, 2019, and claims priority under 35 U.S.C. § 119 from German patent application 10 2018 114 133.5, filed Jun. 13, 2018, the entire contents of all of which are incorporated by reference herein.

A semiconductor laser is specified. Furthermore, a manufacturing method for a semiconductor laser is specified.

A task to be solved is to specify a semiconductor laser which can be produced efficiently.

This task is solved among other things by a semiconductor laser and by a manufacturing method with the characteristics of the independent patent claims. Preferred further developments are subject of the dependent claims.

The semiconductor laser described here comprises a ridge waveguide which is limited by facets. The ridge waveguide has a breakage coating that is flush with the facets. By means of the breakage coating, a breaking wave is damped during the generation of the facets, so that the facets break precisely and a yield during the manufacturing method is increased.

According to at least one embodiment, the semiconductor laser comprises a semiconductor layer sequence. In the semiconductor layer sequence an active zone is arranged. In the active zone a laser radiation is generated during operation.

The semiconductor layer sequence is preferably based on a III-V compound semiconductor material. The semiconductor material is for example a nitride compound semiconductor material like $Al_n In_{1-n-m} Ga_m N$ or a phosphide compound semiconductor material like $Al_n In_{1-n-m} Ga_m P$ or an arsenide compound semiconductor material such as $Al_n In_{1-n-m} Ga_m As$ or such as $Al_n Ga_m In_{1-n-m} As_k P_{1-k}$, where $0 \leq n \leq 1$, $0 \leq m \leq 1$ and n+m 1 and $0 \leq k < 1$ respectively. Preferably for at least one layer or for all layers of the semiconductor layer sequence $0 < n \leq 0.8$, $0.4 \leq m < 1$ and $n+m \leq 0.95$ as well as $0 < k \leq 0.5$. The semiconductor layer sequence may comprise dopants as well as additional components. However, for the sake of simplicity, only the essential constituents of the crystal lattice of the semiconductor layer sequence, i.e. Al, As, Ga, In, N or P, are given, even if these may be partially replaced and/or supplemented by small amounts of other substances. Preferably, the semiconductor layer sequence is based on AlInGaN.

According to at least one embodiment, the semiconductor laser comprises one or more ridge waveguides. The at least one ridge waveguide is formed as an elevation out of the semiconductor layer sequence. An optical wave is guided in the semiconductor layer sequence by means of the ridge waveguide. In particular, the ridge waveguide defines a resonator longitudinal axis of a resonator of the semiconductor laser. The resonator is limited by facets. Preferably, one of the facets is designed as a highly reflective mirror and another of the facets as an output coupler mirror or output surface, especially together with corresponding coatings on the facets.

According to at least one embodiment, the semiconductor laser comprises a passivation layer. The passivation layer partially covers the semiconductor layer sequence on an upper side. The ridge waveguide is also located on the upper side. In particular, the passivation layer leaves an upper side of the ridge waveguide partially or, preferably, completely free.

According to at least one embodiment, the semiconductor laser comprises an electrical contact layer. The electrical contact layer is located directly on the ridge waveguide and is configured for current injection into the semiconductor layer sequence. The electrical contact layer is preferably made of one or more metals and/or of a transparent conductive oxide, TCO for short. The contact layer partially or completely covers the upper side of the ridge waveguide.

According to at least one embodiment, the semiconductor laser includes a metallic electrical connection region. The connection region is arranged directly on the contact layer. The connection region is, for example, a bond pad or a soldering surface. The semiconductor laser may be electrically connected externally via the connection region and may optionally be mechanically attached, for example, by means of a solder. The connection region preferably covers a part of the upper side of the ridge waveguide. Furthermore, the connection region preferably extends on both sides of the ridge waveguide.

According to at least one embodiment, the semiconductor laser comprises a metallic breakage coating. The breakage coating extends directly to the facets of the semiconductor layer sequence and thus to the ridge waveguide. The breakage coating is arranged at least or exclusively on the ridge waveguide.

According to at least one embodiment, the breakage coating is electrically functionless. This means that the breakage coating does not cause any or no significant current expansion and no or no significant current injection into the semiconductor layer sequence and/or into the electrical contact layer.

According to at least one embodiment, the breakage coating comprises a lower speed of sound than the semiconductor layer sequence in the region of the ridge waveguide. The speed of sound refers in particular to the speed of a breaking wave when generating the facets.

In at least one embodiment, the semiconductor laser comprises a semiconductor layer sequence in which an active zone for generating a laser radiation is located. A ridge waveguide is formed as an elevation out of the semiconductor layer sequence. An electrical contact layer is arranged directly on the ridge waveguide and is designed for current injection into the semiconductor layer sequence. A metallic electrical connection region is arranged directly at the contact layer and is configured for external electrical connection of the semiconductor laser. A metallic breakage coating reaches directly to facets of the semiconductor layer sequence and is located at the ridge waveguide. The breakage coating is electrically functionless and comprises a lower speed of sound, in particular for a breaking wave, than the semiconductor layer sequence in the region of the ridge waveguide.

With the semiconductor laser described here it is possible to produce an edge-emitting semiconductor laser with a high optical output power and a high yield. A key parameter for this is the quality of the laser facets. Since the laser facets represent the mirrors bounding the laser resonator, the quality of the resonator depends decisively on the facets being atomically smooth, if possible. To produce such smooth facets, they are usually broken along a crystal direction of a semiconductor crystal for the semiconductor layer sequence. The achievable quality depends on the epitaxial layer sequence, the geometry of the semiconductor layer sequence as well as on the scribing and breaking process. Due to the interactions that occur, there are more stable and less stable combinations, which is directly reflected in the performance of the finished semiconductor lasers and in the yield of the manufacturing process.

Furthermore, it is crucial for the stability of the facets, especially at high output powers, that the facets are not contaminated by overhanging metal. Metallic residues or traces on the facets lead locally to a comparatively high absorption of the laser radiation and thus to hot spots. This can cause a catastrophic facet damage, also known as Catastrophic Optical Mirror Damage or COMD. Therefore, measures must be taken in the manufacturing process to avoid metal overhanging the facets. Furthermore, the stability with respect to COMD may be increased by not pumping the facets electrically, so that the semiconductor layer sequence directly at the facets is not or not significantly supplied with current.

Usually a p-contact metallization and/or a subsequent bond pad is completely removed in the manufacturing process at the position of the later laser facets, so that the facet may be broken later in this metal-free region. This has the advantage that no metal overhangs the facets and that the facets are not electrically pumped to increase COMD stability.

However, this retraction of the metal has a strong effect on the propagation of a breaking wave during facet breaking. This can disturb the morphology of the facets, which has a negative effect on the performance of the semiconductor laser. Furthermore, this is accompanied by considerable yield losses in the manufacturing process.

In the semiconductor laser described here, one or more damping elements for the breaking wave in the form of the breakage coating are applied to the critical points on and/or at the ridge waveguide. In this way, the occurrence of disturbances during facet breaking may be prevented or reduced. Preferably, the damping element is electrically separated from the bond pad, i.e. the electrical connection region. The damping element is preferably electrically separated from the semiconductor layer sequence by an underlying electrical insulating layer.

Furthermore, the damping element, i.e. the breakage coating, is preferably made of a layer stack which is more brittle than ductile. The damping element is made of a material or a layer stack whose average sound propagation speed is lower than that of the material of the semiconductor layer sequence, thus in particular lower than that of GaN.

Furthermore, the damping element is preferably only applied at critical points, i.e. it is not applied to the facet over the entire surface. In this way metallic impurities on the facet can be reduced.

By means of the damping element in the form of the breakage coating described here, the local velocity of the breaking wave when generating the facets is guided in such a way that a smooth breakage is obtained, even at points such as an edge of the ridge waveguide, which otherwise can lead to a disturbance of the breakage. The fact that the damping element is electrically separated from the semiconductor and the bond pad results in a high COMD stability. The rather brittle than ductile design of the damping element prevents the material of the breakage coating from being plastically deformed and/or elongated during facet breaking and thus from lying in the facet region. This also increases the COMD stability.

The yield in the manufacturing process can be significantly increased by the comparatively local application of the breakage coating on the facet and by guiding the breaking wave through the breakage coating.

According to at least one embodiment, the facets are formed as resonator end faces of a resonator for the laser radiation. Due to a refractive index difference to the environment, the facets may serve as mirror surfaces or, preferably, be provided with reflective coatings like Bragg mirrors. In addition, protective coatings may be applied to the facets over the entire surface or in places to prevent or at least significantly slow down corrosion on the facets.

According to at least one embodiment, the breakage coating comprises a layer structure different from the connection region. For example, the breakage coating comprises a reduced number of materials and/or layers compared to the connection region. It is possible that the breakage coating is thinner than the connection region. For example, a thickness of the breakage coating is at most 70% or 50% or 40% and/or at least 10% or 20% of a thickness or average thickness of the connection region.

According to at least one embodiment, the breakage coating is each applied only along a part of the facets. In particular, the breakage coating is limited to the ridge waveguide and a region to the side of the ridge waveguide, wherein the region to the side of the ridge waveguide preferably comprises a width of at most 50% or 20% or 10% of a width of the ridge waveguide itself. In this way metallic contamination of the facet can be avoided or reduced.

According to at least one embodiment, the breakage coating is composed of several congruent sublayers arranged one above the other. Alternatively, these sublayers may also comprise different surfaces when viewed from above. Preferably, all partial layers are metallic layers.

According to at least one embodiment, the thickness of the breakage coating is at least 50 nm or 0.1 µm or 0.2 µm or 0.3 µm. Alternatively or additionally, the thickness of the breakage coating is at most 10 µm or 5 µm or 3 µm or 2 µm. In particular, the thickness of the breakage coating is 1 µm+/−0.5 µm.

According to at least one embodiment, the breakage coating is electrically insulated from the connection region and from the semiconductor layer sequence. In particular, there is no one-piece connection and/or no connection via metallic materials between the breakage coating and the connection region.

According to at least one embodiment, the breakage coating and the connection region are spaced apart from each other in the direction parallel to the ridge waveguide and/or to a longitudinal resonator axis of the semiconductor laser. A distance along this direction between the breakage coating and the connection region is preferably at least 1 µm or 2 µm or 5 µm and/or at most 100 µm or 50 µm or 30 µm or 15 µm.

According to at least one embodiment, the breakage coating is directly connected to the connection region. The breakage coating and the connection region may be formed in one piece and/or there is a direct metallic connection between the breakage coating and the connection region. For example, the breakage coating is formed by one or more sublayers of the connection region. Preferably, however, the breakage coating does not include all sublayers of the connection region.

According to at least one embodiment, the breakage coating is formed as a continuation of the connection region towards the facets. For example, the breakage coating is formed as one or more elongated extensions and/or narrowings of the connection region towards the facets. The breakage coating may comprise a different sequence of layers than the connection region, in particular fewer and/or thinner layers.

According to at least one embodiment, the breakage coating is limited to the upper side of the ridge waveguide in view on the facets. The upper side of the ridge waveguide is partially or completely covered by the breakage coating. Preferably, a degree of coverage of the upper side of the ridge waveguide by the breakage coating is at least 10% or 30% and/or at most 80% or 70%. This is in particular true directly at the facet and viewed on the facet.

According to at least one embodiment, the breakage coating surrounds the ridge waveguide in a U-shape in view on the facets. This means that the upper side of the ridge waveguide and side surfaces of the ridge waveguide are preferably completely or at least predominantly covered by the breakage coating. Predominantly means here and in the following especially at least 60% or 70% or 80%.

According to at least one embodiment, the breakage coating covers the side surfaces of the ridge waveguide completely or predominantly in view on the facets. It is possible that the upper side of the ridge waveguide is only partially covered by the breakage coating, e.g. to a maximum of 40% or 20%, or even free of the breakage coating. In particular, the breakage coating only extends from the side surfaces to the upper side, so that a central region of the upper side of the ridge waveguide may be free of the breakage coating when viewed in plan view.

According to at least one embodiment, the breakage coating comprises a different thickness on the side surfaces than on the upper side in view on the facets. For example, the breakage coating is thinner on the upper side than on the side surfaces. Conversely, the breakage coating may also be thicker on the upper side than on the side surfaces.

According to at least one embodiment, the breakage coating is asymmetrical to the ridge waveguide in view on the facets. In particular, the breakage coating is arranged only on one side of the ridge waveguide, which precedes the ridge waveguide along a direction of breaking when producing the facets.

According to at least one embodiment, the breakage coating is formed as a strip when viewed in plan view. The strip may be oriented parallel to the respective facet and is preferably arranged along its entire length directly at the respective facet. For example, when viewed in plan view, the strip comprises a rectangular or approximately rectangular shape.

According to at least one embodiment, the breakage coating comprises one or more strips when viewed in plan view. The at least one strip is oriented perpendicular to the respective facet. This applies in particular with a tolerance of maximum 30° or 15° or 5°.

The term strip means in particular that a longitudinal expansion is greater by at least a factor of 2 or 3 or 5 than a transverse expansion of the corresponding structure.

According to at least one embodiment, the semiconductor laser comprises an insulating layer. The insulating layer is electrically insulating when the semiconductor laser is used as intended. For example, the insulating layer is formed with an oxide like silicon oxide or a nitride like silicon nitride.

According to at least one embodiment, the insulating layer extends completely between the semiconductor layer sequence and the breakage coating. The breakage coating can be electrically isolated from the semiconductor layer sequence by the insulating layer.

According to at least one embodiment, the insulating layer is structured in the same way as the breakage coating. This means that the insulating layer and the breakage coating may be congruent with each other in plan view at least on the upper side of the ridge waveguide or on the entire upper side of the semiconductor layer sequence. In particular, congruence is achieved with a tolerance of at most 5 µm or 2 µm or 1 µm.

According to at least one embodiment, the semiconductor laser comprises at least one electrically insulating cover layer. The cover layer or the cover layers are arranged directly on the breakage coating, in particular on a side facing away from the semiconductor layer sequence. The cover layer covers the breakage coating predominantly or completely in plan view. Optionally, the cover layer may also cover exposed side surfaces of the breakage coating, in particular on a side of the breakage coating facing away from the facet.

According to at least one embodiment, the cover layer is partially or completely covered by a cover metal layer, which is formed with a metal layer or a stack of metal layers. The cover metal layer is configured in particular to be soldered to an external mounting surface. The cover metal layer allows an improved thermal connection of the semiconductor laser to an external carrier.

According to at least one embodiment, the semiconductor laser comprises one or more facet coatings. The at least one facet coating extends from the facet to the breakage coating. It is possible that the facet coating covers the breakage coating not only partially but completely. Thus, the breakage coating can be completely encapsulated by the facet coating and the semiconductor layer sequence and optionally by the insulating layer and/or the cover layer and/or the passivation layer.

According to at least one embodiment, the contact layer ends at a distance from the facets or there is an electrically insulating layer on the facets between the semiconductor layer sequence and the contact layer. This makes it possible that no current is injected into the semiconductor layer sequence directly at the facets.

According to at least one embodiment, the breakage coating on the semiconductor layer sequence comprises a metallic adhesion promoting layer and/or a metallic auxiliary layer.

Examples for the adhesion promoting layer and/or for the auxiliary layer are Ti, Cr, Ni, Ni—Pt, Ti—Pt, Ti—Pd.

According to at least one embodiment, the breakage coating comprises at least two of the following materials, preferably as sublayers: Au, Cr, Ni, Pd, Pd, Ti.

According to at least one embodiment, the breakage coating comprises a titanium sublayer and a gold sublayer or consists of these two sub layers. The gold sublayer is preferably arranged on a side of the titanium sublayer facing away from the semiconductor layer sequence. It is possible that the gold layer comprises a thickness that is at least a factor of 2 or 3 and/or at most a factor of 200 or 20 or 8 greater than a thickness of titanium layer. In particular, the titanium sublayer is formed as an adhesion promoting layer of the gold sublayer towards the semiconductor layer sequence, and the adjustment of the speed of sound of the breakage coating is essentially carried out via the gold partial layer.

In addition to the Ti—Au layer pair, the following layer pairs, layer triplets and layer quadruples are particularly suitable for the breakage coating, each in a direction away from the semiconductor layer sequence: Cr—Au, Ti—Pt—Au, Ti—Pd—Au, Cr—Pt—Au, Cr—Pd—Au, Ni—Au, Ni—Pd—Au, Ni—Pt—Au, Ni—Pd—Pt—Au, Ti—Pd—Pt—Au.

In addition, a manufacturing method is specified. The manufacturing method is preferably used to produce a semiconductor laser, as described in connection with one or more of the embodiments mentioned above. Features of the semiconductor laser are therefore also disclosed for the manufacturing method and vice versa.

In at least one embodiment, the manufacturing method comprises the following steps, preferably in the order given:
   Growing the semiconductor layer sequence on a growth substrate such as a GaN substrate,
   Generation of ridge waveguides from the semiconductor layer sequence, for example by etching,
   Application of the passivation layer and the contact layer,
   Application of the connection region and the breakage coating so that the breakage coating extends over subsequent separation lines,
   Creating scribe trenches on the upper side, whereby the ridge waveguides and the breakage coating are preferably each remain spaced apart from the scribe trenches and
   Cleaving of the semiconductor layer sequence along the separation lines, so that the facets are created and the breakage coating is split at the facets.

According to at least one embodiment, a breaking wave during the cleaving of the semiconductor layer sequence and the growth substrate is damped by the breakage coating. This is achieved in particular by the fact that the speed of sound and/or a speed of a breaking wave during cleaving in the breakage coating is at least 20% or 30% or 50% and/or at most 90% or 80% or 70% of the speed of sound and/or a speed of a breaking wave of the semiconductor layer sequence at the ridge waveguide.

In the following, a semiconductor laser described here and a manufacturing method described here are explained in more detail with reference to the drawings by exemplary embodiments. Identical reference signs indicate identical elements in the individual figures. However, no scale references are shown, but individual elements can be oversized for better understanding.

In the Figures:

FIGS. 1 to 5 show in each figure part A a schematic plan view and in each figure part B views on the facet of an exemplary embodiment of a semiconductor laser described here, FIG. 6 shows in figure part A a schematic plan view and in figure parts B and C a schematic view on the facets of exemplary embodiments of semiconductor lasers described here, FIG. 7 shows in figure part A a schematic plan view and in figure part B a schematic view on a facet of an exemplary embodiment of a semiconductor laser described here, FIG. 8 shows a schematic plan view of an exemplary embodiment of a semiconductor laser described here, FIGS. 9 to 12 show in figure parts A schematic plan views and in figure parts B schematic views on facets of exemplary embodiments of semiconductor lasers described here, FIG. 13 shows in figure part A a schematic view on a facet and in figure parts B and C each a schematic sectional view through the ridge waveguide of exemplary embodiments of semiconductor lasers described here, FIG. 14 shows a schematic sectional view through a ridge waveguide of an exemplary embodiment of a semiconductor laser described here, FIG. 15 shows a schematic sectional view through ridge waveguides before generating the facets of exemplary embodiments of semiconductor lasers described here, FIG. 16 shows in figure parts A, B, C and E schematic sectional views and in figure part D a schematic plan view of method steps of a manufacturing method for semiconductor lasers described here, and FIGS. 17 and 18 schematic views on facets of exemplary embodiments of semiconductor lasers described here.

FIG. 1A shows a plan view and FIG. 1B a view on a facet of an exemplary embodiment of a semiconductor laser 1. The semiconductor laser 1 comprises a semiconductor layer sequence 2, which is located on a substrate 25. The substrate is for example a growth substrate. The semiconductor layer sequence 2 comprises an active zone 22. During operation, laser radiation is generated in the active zone 22 by electroluminescence. The semiconductor layer sequence 2 is based on the material system AlInGaN.

A ridge waveguide 3 is formed out of the semiconductor layer sequence 2. The ridge waveguide 3 forms an elevation over the remaining regions of the semiconductor layer sequence 2. The ridge waveguide 3 guides a generated laser radiation between two facets 27, which form resonator end faces of the semiconductor laser 1. The semiconductor layer sequence 2 is covered by a passivation layer 4 on an upper side 20 with the exception of the ridge waveguide 3. On the upper side of the ridge waveguide 3 there is preferably an electrical contact layer 5 arranged, for example made of a metal or a TCO.

For the electrical external contacting of the semiconductor laser 1 there is an electrical connection region 6, which is formed by one or more metal layers, for example by a layer stack Ti/Pt/Au/Ti/Pt/Au. The connection region 6 is formed, for example, for bonding wire contacting or soldering. Preferably, the connection region 6 covers the upper side 20 extensively and extends on and both sides next to the ridge waveguide 3. The connection region 6 ends at a distance from the facets 27.

Furthermore, the semiconductor laser 1 comprises a breakage coating 7. The breakage coating 7 is arranged on both facets 27 and extends in strips parallel to the facets 27 and directly along the facets 27. The breakage coating 7 is limited to the ridge waveguide 3, so that the facets 27 are predominantly free of the breakage coating 7 in view on the facets 27.

In view on the facets 27, the breakage coating 7 is U-shaped. Thus, the breakage coating 7 covers the upper side 20 of the ridge waveguide 3 and side surfaces 37 of the ridge waveguide 3 each completely. At the side surfaces 37, the passivation layer 4 is arranged between the breakage coating 7 and the semiconductor layer sequence 2.

The breakage coating 7 is preferably composed of several sublayers, indicated by a dashed line. At the semiconductor layer sequence 2 preferably a Ti-layer for adhesion promotion is arranged. The Ti-layer is covered by an Au-layer. The Au-layer is preferably thicker than the Ti-layer. For example, the breakage coating 7 comprises a thickness of approximately 1 µm, wherein the Ti-layer makes up a portion of approximately 200 nm and the rest is formed by the Au-layer. Alternatively, a 5 nm thick Ti-layer and a 100 nm thick Au-layer or a 50 nm thick Ti-layer and a 1000 nm thick Au-layer are used.

For example, a width of the ridge waveguide 3 is between 1 µm and 70 µm. A length of the ridge waveguide 3 between the facets 27 is preferably at least 0.3 mm and/or at most 3 mm. A height of the ridge waveguide 3 above the other regions of the semiconductor layer sequence 2 is, for example, at least 0.3 µm and/or at most 3 µm. The stripe of the breakage coating 7 along the facets 27 is preferably as narrow as possible and comprises, for example, a width of at least 2 µm or 5 µm or 10 µm and/or at most 100 µm or 50 µm or 20 µm. A distance between the breakage coating 7 and the connection region 6, for example, is at least 5 µm and/or at most 50 µm. These values can apply individually or together accordingly to all other exemplary embodiments.

The breakage coating 7 dampens the propagation of breaking waves during the cleaving of facets 27, thus ensuring high cleaving and facet quality. At the same time, the breakage coating 7 is only applied in certain region at the facets 27 so that metal carryover to the facets 27 during cleaving of the same is prevented, thus reducing the probability of COMD. Thus, the breakage coating 7 does not perform any electrical functions, but fulfils exclusively mechanical purposes. In particular, breakage coating 7 adjusts the breaking propagation speed when cleaving facets 27 directly on facets 27.

Deviating from FIG. 1, in the exemplary embodiment of FIG. 2, the breakage coating 7 is arranged exclusively at the side surfaces 37 of the ridge waveguide 3. The upper side of the ridge waveguide 3 is free of the breakage coating 7.

In deviation from FIG. 2, the breakage coating 7 according to FIG. 3 is formed as an extension of the electrical connection region 6. However, the breakage coating 7 is not in electrical contact with the semiconductor layer sequence 2, but is electrically separated from the semiconductor layer sequence 2 by the passivation layer 4.

Furthermore, FIG. 2 shows that directly at the facets 27 the contact layer 5 from FIG. 1 is not present. Thus, a current supply directly at the facets 27 can be prevented. A corresponding configuration of the ridge waveguide 3 without a contact layer 5 directly at the facets 27 is also possible in all other exemplary embodiments.

In deviation from FIG. 3, the breakage coating 7 in FIG. 4 extends from the side surfaces 37 partially to the upper side 20 of the ridge waveguide 3. In this case, the breakage coating 7 can be stepped on a side facing away from the semiconductor layer sequence 2 when looking in view on the facets 27.

The passivation layer 4 can extend equally to the ridge waveguide 3, in contrast to FIG. 4. The contact layer 5 can alternatively or additionally be removed below the breakage coating 7.

FIG. 5 shows that the breakage coating 7 is only located on one of the side surfaces 37 of the ridge waveguide 3. For example, from the side of the breakage coating 7, a cleaving of facets 27 takes place.

This asymmetrical application of the breakage coating 7, as shown in FIG. 5, can also be applied to all other exemplary embodiments of the breakage coating 7.

FIG. 6 shows that the breakage coating 7 comprises different thicknesses on the upper side 20 of the ridge waveguide 3 than on the side surfaces 37.

According to FIG. 6B, the breakage coating 7 is thicker on the upper side 20 than on the side surfaces 37.

In FIG. 6C, the breakage coating 7 is thinner in a central region above the upper side 20 than at the edges. Directly at the longitudinal edges of the ridge waveguide 3 as well as at the side surfaces 37, the breakage coating 7 is thus thicker, for example at least a factor of 2 or 3 thicker than in the central region above the upper side 20. The preferably central region above the upper side 20 accounts for a share of the total upper side 20 of the ridge waveguide 3 of at least 40% or 60% or 80% and/or of at most 90% or 70%.

FIG. 7 illustrates that the breakage coating 7 only partially covers the upper side 20 of the ridge waveguide 3, wherein the breakage coating 7 is limited to the upper side 20. The breakage coating 7 can be centered on the upper side 20. Alternatively, a decentered arrangement is possible, similar to FIG. 5. The breakage coating 7 preferably covers the upper side 20 of the ridge waveguide 3 to at least 40% or 60% or 70% and/or to at most 90% or 80%.

FIG. 8 shows that the breakage coating 7 is divided into several strips when viewed in plan view. The strips are electrically separated from the connection region 6 and extend perpendicularly or approximately perpendicularly to the facets 27. The three strips, for example, can each be the same width and length when viewed from above or, in contrast to FIG. 8, can also comprise different widths and/or different lengths.

FIG. 9 illustrates that instead of the three stripes of FIG. 8, there are a total of four stripes of the breakage coating 7. The strips can be symmetrically arranged on the ridge waveguide 3. There can also be more than four strips. The outer strips may also cover the side surfaces 37 or, unlike in FIGS. 8 and 9, the side surfaces 37 may be free of breakage coating 7.

In the exemplary embodiment in FIG. 10, an additional electrically insulating layer 9 is only present at the facets 27. The insulating layer 9 can extend as a comparatively narrow strip completely along the facets 27. This means that the passivation layer 4 and the insulating layer 9 lie directly on top of each other at the facets 27. The insulating layer 9 electrically separates the breakage coating 7 from the semiconductor layer sequence 2 and in particular also from the contact layer 5.

Deviating from FIG. 10, the contact layer 5 is optionally not present at the facets 27, analogous to FIG. 2.

FIG. 11 illustrates that the strips of the breakage coating 7 may extend from the connection region 6. In this design, too, the breakage coating 7 and the connection region 6 are preferably formed differently from each other and comprise different stacks of metal layers, for example.

Such a geometry of the strips of breakage coating 7, as shown in FIG. 11, can also be present, in particular, in the exemplary embodiments of FIGS. 8 to 10. If such an insulating layer 9 is present, the breakage coating 7 may also be formed as an extension of the connection region 6 in the geometries of the exemplary embodiments of FIG. 1, 6 or 7.

FIG. 12 shows that the insulating layer 9 is structured in the same way as the breakage coating 7, so that the breakage coating 7 and the insulating layer 9 are congruent.

In all other respects, the remarks to FIGS. 10 and 11 apply accordingly to FIG. 12.

FIG. 13A shows a view on the facet 27 and FIGS. 13B and 13C show sectional views in a direction perpendicular to the drawing plane of FIG. 13A through the region marked in FIG. 13A.

A cover layer 8, which is electrically insulating, is applied to each of the breakage coating 7.

The cover layer 8, for example, is formed with an electrically insulating oxide or nitride. A thickness of the cover layer 8 is preferably 200 nm or 100 nm at most. The same applies to the insulating layer 9 of FIGS. 10 to 12.

In FIG. 13B, the cover layer 8 is limited to a side of the breakage coating 7 facing away from the semiconductor layer sequence 2.

In contrast, the cover layer 8 in FIG. 13C also extends to a side of the breakage coating 7 facing away from the facet 27. Thus, electrical connections can be prevented over the breakage coating 7, for example when soldering the semiconductor laser 1 to an undrawn external carrier, because the breakage coating 7 is encapsulated by the cover layer 8.

The view in FIG. 14 corresponds to the views in FIGS. 13B and 13C. In addition, a facet coating 28 is arranged, for example as a mirror layer or anti-reflective layer. With the facet coating 28, a reflectivity of facet 27 for the laser radiation can be adjusted.

The facet coating 28 extends from facet 27 to an upper side of the cover layer 8, which is facing away from the semiconductor layer sequence 2. Thus, the breakage coating 7, seen in cross-section, may be completely encapsulated by the semiconductor layer sequence together with facet coating 28 and the cover layer 8 and electrically separated from a surroundings.

The layer stack at facet 27, mainly formed by the breakage coating 7 and optionally by the insulating layer 9 and the cover layer 8, allows to adjust the breaking wave when generating facets 27. For example, the speed of sound of gold is approximately 1740 m/s and of titanium approximately 4140 m/s. By appropriate mixing ratios, intermediate effective speed of sounds can be set. Silicon dioxide, on the other hand, comprises a speed of sound of about 5900 m/s.

In comparison, the speed of sound of GaN-based materials are in the range around 3.5 km/s to 5.5 km/s, depending on the specific material composition and also on the geometry of the ridge waveguide 3 and the respective crystal orientation. For example, a silicon dioxide layer at the facet alone would not allow an adjustment of the breaking wave, since the speed of sound of silicon dioxide is too high for this purpose.

In the exemplary embodiment of FIG. 15 it is illustrated that a cover metal layer 81 is applied to the cover layer 8. By means of the cover metal layer 81, it is possible to achieve a mechanical and in particular a thermal connection of the semiconductor layer sequence 2 via the breakage coating 7 when the semiconductor laser 1 is mounted via the side with the ridge waveguide 3. According to FIG. 15, a separation line 12 for the breaking process preferably runs centrally through the breakage coating 7, which is not yet affected by the separation, together with the associated components 8, 81.

Especially this configuration of FIG. 15 allows a so-called p-down installation over the side with the ridge waveguide 3.

FIG. 16 illustrates a manufacturing method for semiconductor lasers 1. According to FIG. 16A the semiconductor layer sequence 2 is grown with the active zone 22 on the growth substrate 25.

FIG. 16B illustrates that the ridge waveguide 3 is structured out of the semiconductor layer sequence 2.

FIG. 16C shows that the further components 4, 5, 6, 7 are applied. To simplify the illustration, the further components 4, 5, 6, 7 are not or only partially drawn in the other parts of FIG. 16.

Figure 7:
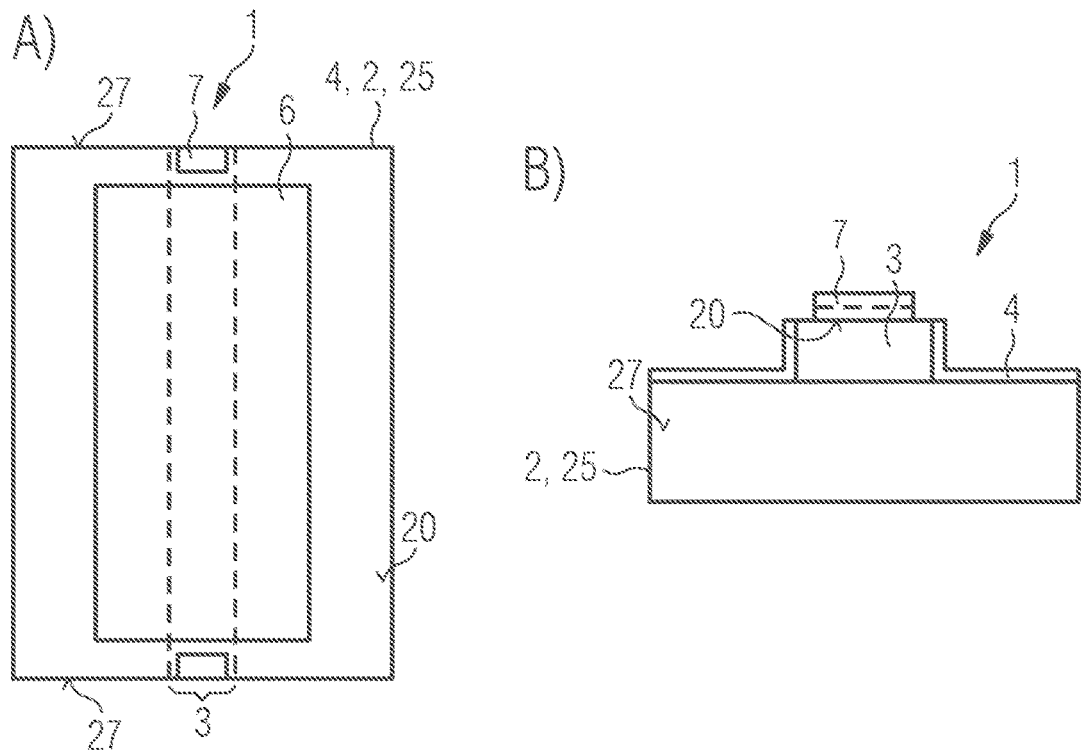
Figure 8:
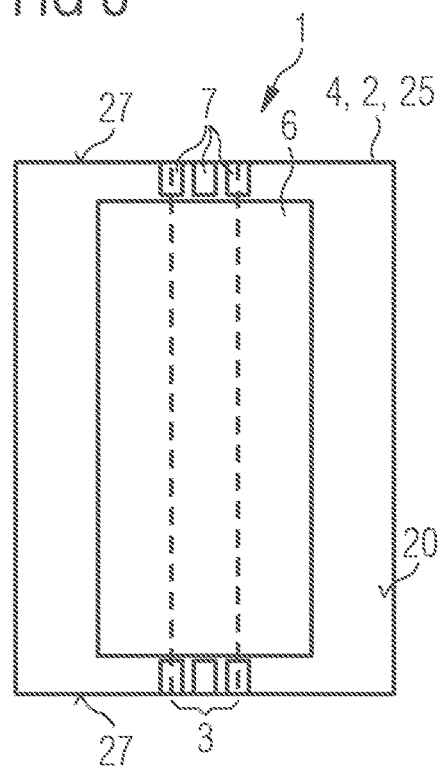
Figure 9:
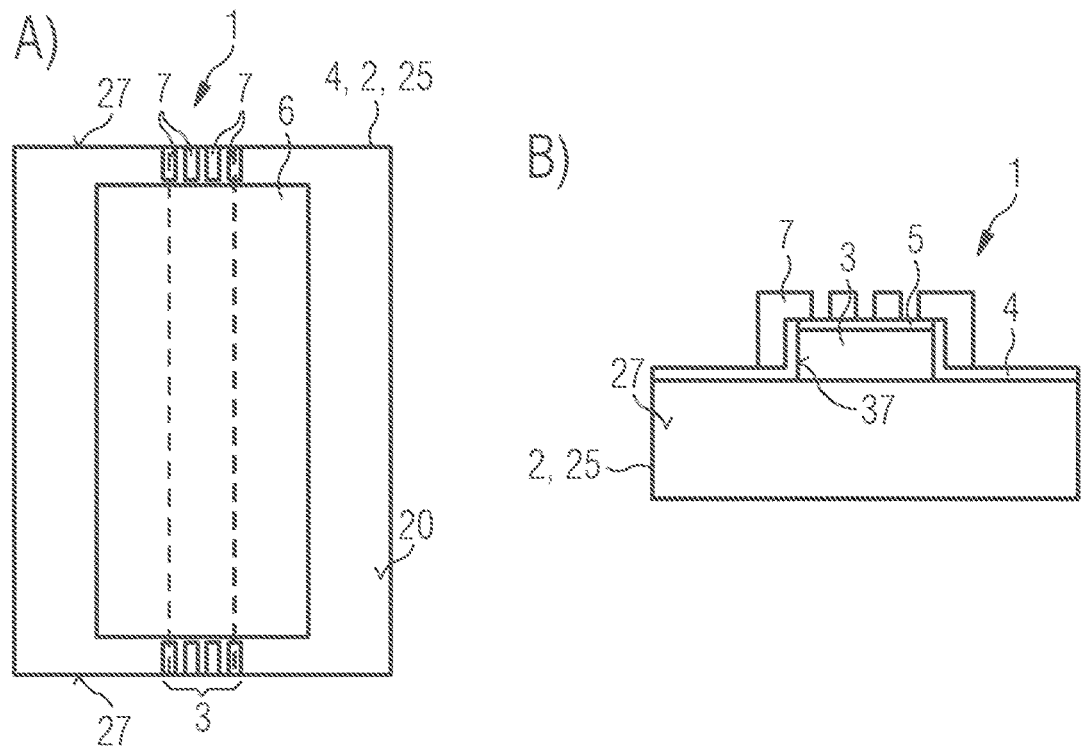
Figure 10:
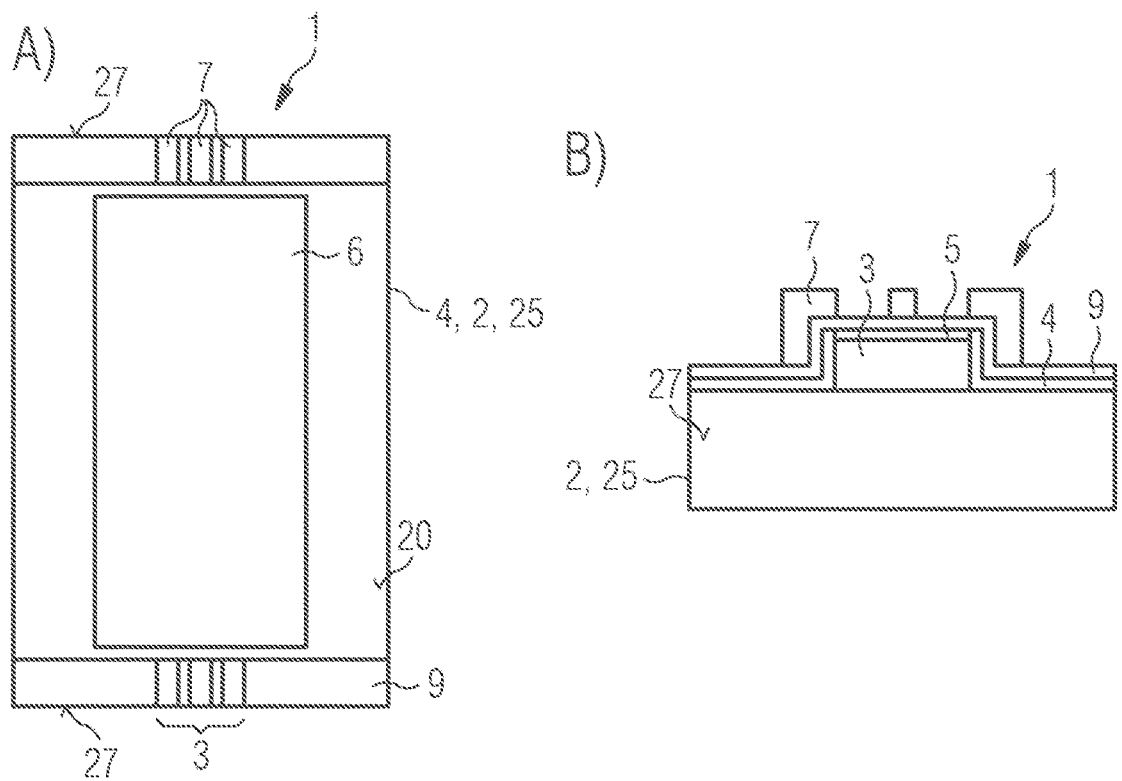
Figure 11:
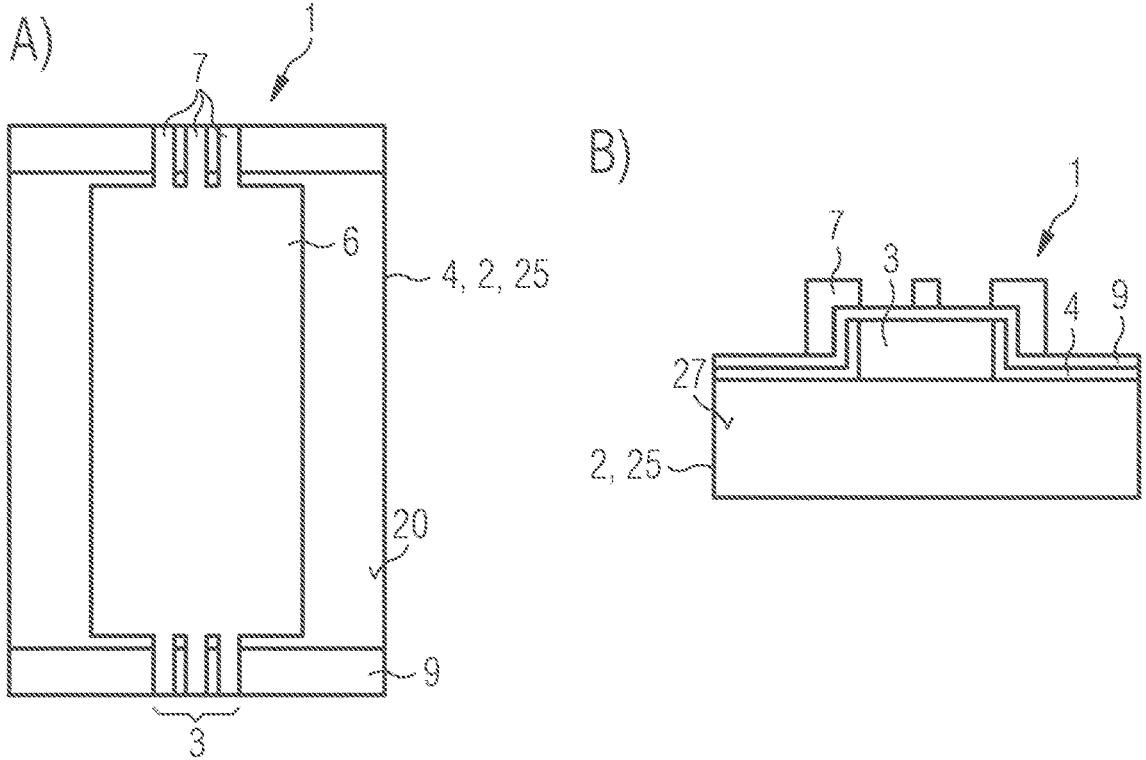
Figure 12:
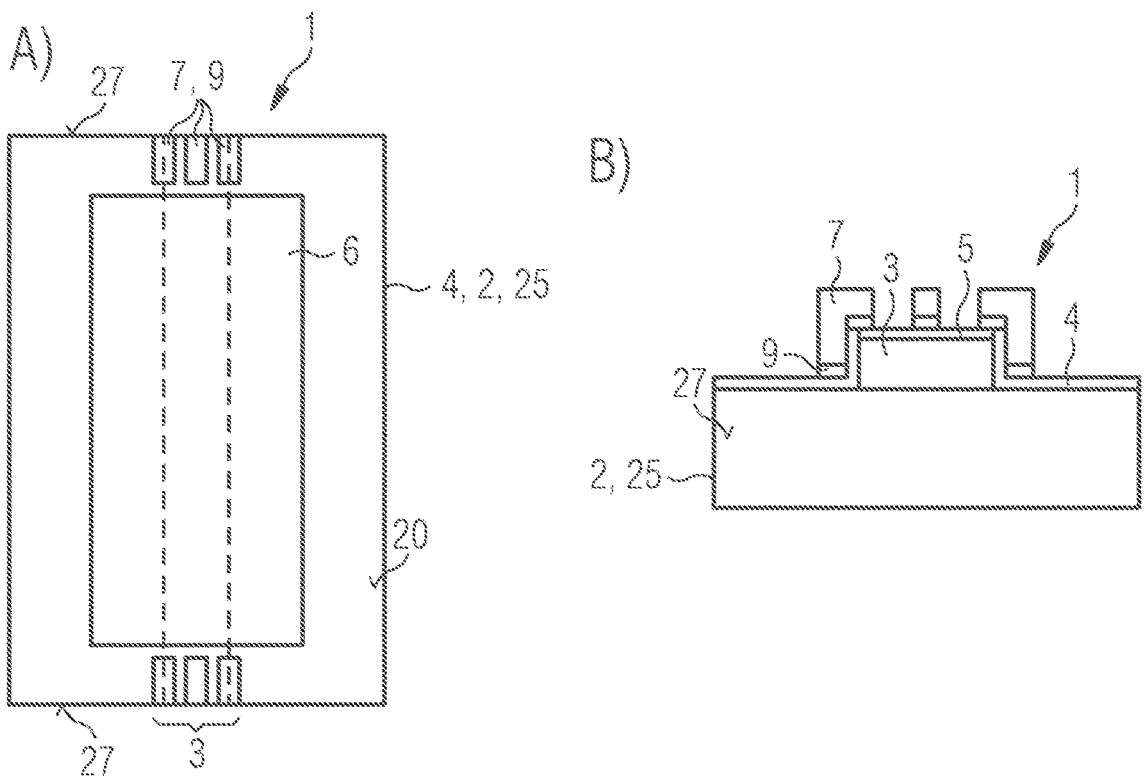
Figure 14:
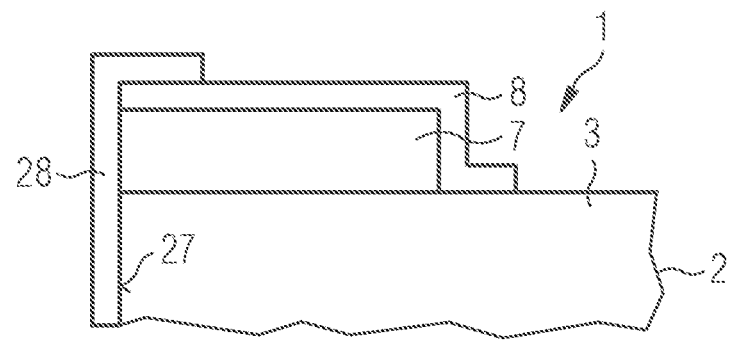
Figure 15:
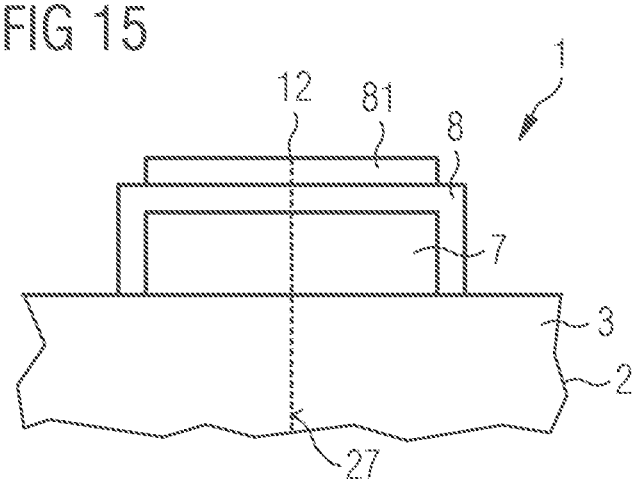

In the plan view of FIG. 16D it is illustrated that scribe trenches 10 are created along the separation lines 12. One of the scribe trenches 10 is preferably located at an outer edge of the semiconductor layer sequence 2 and the growth substrate 25. Optionally, further scribe trenches 10 are located between at least some of the ridge waveguides 3. The ridge waveguides 3 and also the breakage coating 7 are preferably spaced from the scribe trenches 10. The scribe trenches 10 are created with a non-drawn scribing tool.

The sectional view of FIG. 16 illustrates that facets 27 are created by breaking along the separation lines 10 starting from the edge scribe trench 10. A cleaving tool 11 is used on a side of the growth substrate 25 facing away from the ridge waveguides 3. Thus, breaking is performed through the breakage coatings 7.

Optionally, separation to individual semiconductor lasers 1 or to semiconductor laser bars 1, which comprise several ridge waveguides 3, is performed along severing lines 13. The severing lines 13 run parallel to the ridge waveguides 3.

Figure 17:
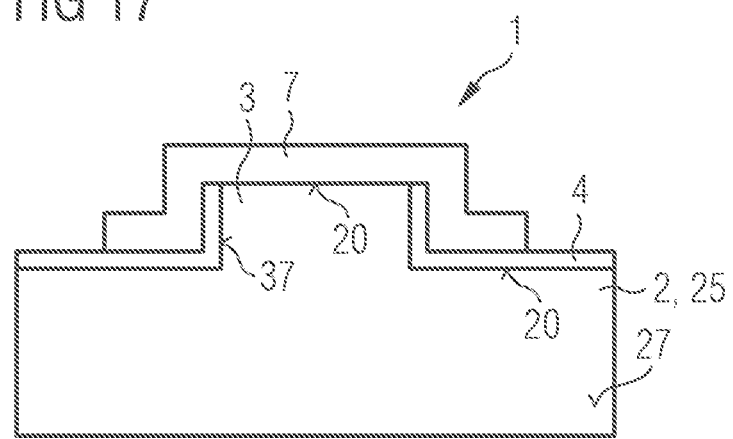

In the exemplary embodiment of FIG. 17, the breakage coating 7 extends from the upper side 20 of the ridge waveguide 3 over its side surfaces 37 also to the upper side of the semiconductor layer sequence 2 next to the ridge waveguide 3. A region of the upper side 20 of the semiconductor layer sequence 2 next to the ridge waveguide 3, which is covered by the breakage coating 7, is preferably relatively narrow. For example, this region comprises a width of 150% or 75% or 40% of the width of the ridge waveguide 3 on each side of the ridge waveguide 3.

Figure 18:
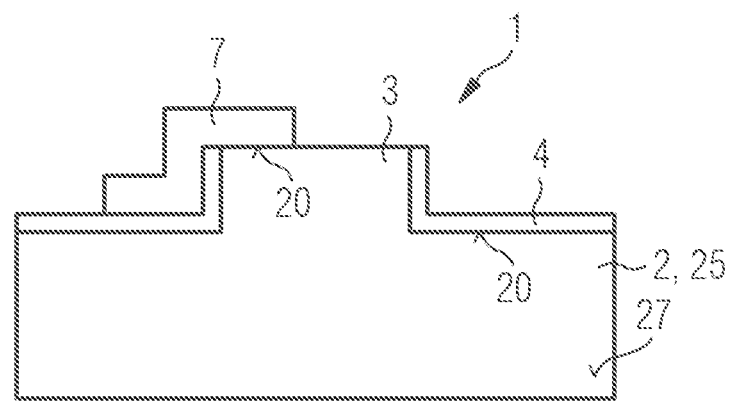

The exemplary embodiment of FIG. 18 corresponds to a combination of the examples in FIGS. 17 and 5. The upper side 20 of the ridge waveguide 3 is preferably covered by the breakage coating 7 to a maximum of 50% or 30%.

Unless otherwise indicated, the components shown in the figures preferably directly follow one another in the order given. Layers not touching each other in the figures are preferably spaced apart. If lines are drawn parallel to each other, the corresponding surfaces are preferably aligned parallel to each other. Likewise, unless otherwise indicated, the relative positions of the drawn components to each other are correctly shown in the figures.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

REFERENCES 1 semiconductor laser
2 semiconductor layer sequence
20 upper side
22 active zone
25 growth substrate
27 facet
28 facet coating
3 ridge waveguide
37 side surface
4 passivation layer
5 electrical contact layer
6 electrical connection region
7 breakage coating
8 cover layer
81 cover metal layer
9 insulating layer
10 scribe trenches
12 separation line
13 severing line

The invention claimed is:

1. A semiconductor laser comprising:
a semiconductor layer sequence in which an active zone for generating a laser radiation is located;
a ridge waveguide, which is formed as an elevation out of the semiconductor layer sequence;
an electrical contact layer directly on the ridge waveguide for current injection into the semiconductor layer sequence;

a metallic electrical connection region directly on the contact layer for external electrical connection of the semiconductor laser at an upper side of the semiconductor layer sequence; and a metallic breakage coating, which reaches directly to facets of the semiconductor layer sequence and which is arranged on the ridge waveguide, wherein the breakage coating is electrically functionless and comprises a lower speed of sound than the semiconductor layer sequence in the region of the ridge waveguide.

2. The semiconductor laser according to claim 1,
wherein
the facets are formed as resonator end faces of a resonator for the laser radiation;
the breakage coating comprises a layer structure different from the connection region;
the breakage coating is each applied only along a part of the facets;
the breakage coating is composed of several congruently arranged sublayers; and
a thickness of the breakage coating is between 0.1 μm and 3 μm inclusive.

3. The semiconductor laser according to claim 1,
wherein the breakage coating is electrically insulated from the connection region and from the semiconductor layer sequence.

4. The semiconductor laser according to claim 1,
wherein a distance between the breakage coating and the connection region in the direction parallel to the ridge waveguide is between 2 μm and 50 μm inclusive.

5. The semiconductor laser according to claim 1,
wherein the breakage coating is directly connected to the connection region and is formed as a continuation of the connection region towards the facets.

6. The semiconductor laser according to claim 1,
wherein the breakage coating is limited to the upper side of the ridge waveguide in view on the facets and partially or completely covers the upper side of the ridge waveguide in view on the facets.

7. The semiconductor laser according to claim 1,
wherein the breakage coating surrounds the ridge waveguide in a U-shape in view on the facets, so that the upper side of the ridge waveguide and side surfaces of the ridge waveguide are each completely covered by the breakage coating.

8. The semiconductor laser according to claim 1,
wherein side surfaces of the ridge waveguide are each completely covered by the breakage coating in view on the facets, and
wherein the upper side of the ridge waveguide is only partially covered by the breakage coating or is free of the breakage coating.

9. The semiconductor laser according to claim 1,
wherein the breakage coating comprises a different thickness on the side surfaces than on the upper side in view on the facets.

10. The semiconductor laser according to claim 1,
wherein the breakage coating is formed as a strip parallel to the respective facet when viewed in plan view.

11. The semiconductor laser according to claim 1,
wherein the breakage coating comprises a plurality of strips as seen in plan view, which run perpendicular to the respective facet.

12. The semiconductor laser according to claim 1,
further comprising an electrically insulating layer,
wherein the insulating layer extends completely between the semiconductor layer sequence and the breakage coating.

13. The semiconductor laser according to claim 12,
wherein the insulating layer is structured in the same way as the breakage coating, so that the insulating layer and the breakage coating are congruent with one another at least on the upper side of the ridge waveguide when viewed in plan view.

14. The semiconductor laser according to claim 1,
further comprising an electrically insulating cover layer directly on the breakage coating,
wherein the cover layer completely covers the breakage coating at least when viewed from above, and
wherein the cover layer is partially or completely covered with a cover metal layer.

15. The semiconductor laser according to claim 1,
further comprising a facet coating,
wherein the facet coating extends up to the breakage coating.

16. The semiconductor laser according to claim 1,
wherein the contact layer ends at a distance from the facets so that no current is injected into the semiconductor layer sequence directly at the facets.

17. The semiconductor laser according to claim 1,
wherein the semiconductor layer sequence is based on AlInGaN and the breakage coating comprises a Ti-sublayer and an Au-sublayer on a side of the Ti-sublayer facing away from the semiconductor layer sequence, and
wherein the Au-sublayer is at least a factor 2 and at most a factor 20 thicker than the Ti-sublayer.

18. A manufacturing method for a semiconductor laser according to claim 1, comprising:
growing the semiconductor layer sequence on a growth substrate;
generating the ridge waveguides from the semiconductor layer sequence;
applying a passivation layer and the contact layer;
applying the connection region and the breakage coating so that the breakage coating each extends over separation lines;
creating scribe trenches on the upper side, wherein the ridge waveguides and the breakage coating remain spaced apart from the scribe trenches; and
cleaving the semiconductor layer sequence along the separation lines so that the facets are created and the breakage coating is split at the facets.

19. The method according to claim 18,
wherein during cleaving, a breaking wave is damped by the breakage coating, and
wherein the speed of sound during cleaving in the breakage coating is between 30% and 80% of the speed of sound of the semiconductor layer sequence at the ridge waveguide.

20. A semiconductor laser comprising:
a semiconductor layer sequence in which an active zone for generating a laser radiation is located;
a ridge waveguide, which is formed as an elevation out of the semiconductor layer sequence;
an electrical contact layer directly on the ridge waveguide for current injection into the semiconductor layer sequence;
a metallic electrical connection region directly on the contact layer for external electrical connection of the semiconductor laser at an upper side of the semiconductor layer sequence; and a metallic breakage coating, which reaches directly to facets of the semiconductor layer sequence and which is arranged on the ridge waveguide, wherein the breakage coating is electrically functionless and comprises a lower speed of sound than the semiconductor layer sequence in the region of the ridge waveguide, and the breakage coating in view on the facets covers side surfaces of the ridge waveguide completely or predominantly or the breakage coating is limited to an upper side of the ridge waveguide.

\* \* \* \* \*